United States Patent
Taipale et al.

(10) Patent No.: US 7,436,252 B2
(45) Date of Patent: Oct. 14, 2008

(54) PERFORMING A COORDINATE ROTATION DIGITAL COMPUTER (CORDIC) OPERATION FOR AMPLITUDE MODULATION (AM) DEMODULATION

(75) Inventors: Dana Taipale, Austin, TX (US); Javier Elenes, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 78 days.

(21) Appl. No.: 11/529,076

(22) Filed: Sep. 28, 2006

(65) Prior Publication Data
US 2008/0079485 A1 Apr. 3, 2008

(51) Int. Cl.
*H03D 1/00* (2006.01)
(52) U.S. Cl. ....................... 329/360; 455/337
(58) Field of Classification Search ............. 329/347, 329/358, 360, 361; 455/337
See application file for complete search history.

(56) References Cited

U.S. PATENT DOCUMENTS 5,561,716 A * 10/1996 Kasser et al. ................. 381/15

OTHER PUBLICATIONS

U.S. Appl. No. 11/396,097, filed Mar. 31, 2006, entitled "Transceiver Having Multiple Signal Processing Modes Of Operation," by Lawrence Der et al.
U.S. Appl. No. 11/529,066, filed Sep. 28, 2006, entitled "Automatic Volume Control For Amplitude Modulated Signals," by Dana Taipale and Javier Elenes.

* cited by examiner

*Primary Examiner*—David Mis
(74) *Attorney, Agent, or Firm*—Trop, Pruner & Hu, P.C.

(57) ABSTRACT

In one aspect, the present invention includes a method for receiving an amplitude modulation (AM) signal in a receiver and performing a coordinate rotation digital computer (CORDIC) operation in obtaining a demodulated AM signal. The demodulated AM signal may be obtained from a magnitude output of the CORDIC operation or as a real output of a multiplication between a complex baseband signal and a demodulating carrier signal generated in a feedback loop.

23 Claims, 5 Drawing Sheets

US 7,436,252 B2

PERFORMING A COORDINATE ROTATION DIGITAL COMPUTER (CORDIC) OPERATION FOR AMPLITUDE MODULATION (AM) DEMODULATION

Embodiments of the present invention relate to radio receivers, and more particularly to such receivers including an amplitude modulation (AM) receiver.

BACKGROUND

Radio receivers such as AM and frequency modulation (FM) receivers are well known and are pervasive. Conventionally, these receivers have been formed of analog circuitry to receive an incoming radio frequency (RF) signal, downconvert the signal, and demodulate the downconverted signal to obtain an audio signal for output. Typically, the circuitry for AM and FM receivers, even in a combined radio, includes separate dedicated paths for AM and FM operation. While such analog-based circuitry may perform well, the area associated with this analog circuitry typically exceeds that used for digital circuitry, and the analog receivers typically include many discrete components. In contrast, digital circuitry is generally available in ever-decreasing sizes, as the benefits of advanced semiconductor processes provide for greater integration benefits. Furthermore, the cost of digital integrated circuits (ICs) is generally less than corresponding analog circuitry.

Accordingly, some radio receivers are being designed to incorporate greater amounts of digital circuitry. While such circuitry may improve performance and can be formed in small packages, typically there are complexities in processing RF signals that require significant digital processing to match the relatively simple circuitry of an analog receiver.

Additional issues exist in radio receivers. One such issue is finely tuning to a desired frequency. To effect such fine tuning, many receivers include an automatic frequency control (AFC) circuit to receive a feedback signal from a downconverted incoming signal in an effort to finely tune a local oscillator (LO) that is used to downmix the incoming signal to the desired frequency. Typically such AFC circuitry is present in a front end of the receiver to receive an output of the downconverting mixer and, via the action of feedback, attempts to finely tune the LO to obtain the desired channel frequency. However, this circuitry raises complexity and consumes additional circuit area and power.

SUMMARY OF THE INVENTION

In one aspect, the present invention includes a method for receiving an amplitude modulation (AM) signal in a receiver and performing a coordinate rotation digital computer (CORDIC) operation in obtaining a demodulated AM signal. The demodulated AM signal may be obtained from a magnitude output of the CORDIC operation or as a real output of a multiplication between a complex baseband signal and a demodulating carrier signal generated in a feedback loop. A phase output of the CORDIC operation may be provided to the feedback loop, which may generate different values to provide for the multiplication, depending on a selected output for the demodulated signal.

Another aspect of the present invention is directed to an apparatus that includes a receiver to receive an AM signal and generate a complex baseband signal therefrom, a combiner to receive the complex baseband signal and a demodulating carrier signal of a feedback loop and to generate a complex output therefrom, and a CORDIC engine to perform a CORDIC function on the complex output to obtain a polar result. In certain implementations, a magnitude of the polar result may correspond to a demodulated signal, while in other implementations a real portion of the combiner output may correspond to the demodulated signal. In some embodiments, a controller may select the combiner output or the CORDIC engine output as a source of the demodulated signal. The CORDIC engine may be a software routine performed by a processor such as a digital signal processor (DSP).

In one implementation, the feedback loop may be coupled to an output of the CORDIC engine to generate the demodulating carrier signal, and may include a loop filter coupled to an output of the CORDIC engine and a controlled oscillator coupled to an output of the loop filter, where the controlled oscillator generates the demodulating carrier signal. The feedback loop may be used to enable automatic frequency control of the AM signal without a dedicated detector. In one embodiment, the feedback loop may include a loop filter coupled to an output of the CORDIC engine and a controlled oscillator coupled to an output of the loop filter.

In one implementation, the method may be performed using a combined AM/FM receiver in which operation may be controlled to be in AM or FM mode. In such an implementation, software for the AM mode of operation may be executed in a DSP responsive to selection of the AM mode, while software for the FM mode may be executed in the DSP responsive to selection of the FM mode.

While embodiments may be implemented in many different forms, in one embodiment an apparatus may take the form of an integrated circuit (IC) including a digital demodulator and a feedback loop as described above. Furthermore, some implementations may be incorporated in a receiver that includes a mixer to downconvert an incoming signal to an intermediate frequency (IF) signal, a digitizer to digitize the IF signal, a frequency synthesizer to downconvert the digitized IF signal to a baseband signal, a demodulator to demodulate the baseband signal to generate a demodulated signal using a CORDIC operation.

DETAILED DESCRIPTION

In various embodiments, an incoming radio frequency (RF) signal can be downconverted to a complex baseband signal that can then be processed by various circuitry to obtain a demodulated signal. Computations then may be performed on the complex signal to obtain magnitude information that may correspond to a demodulated signal. At the same time, phase information generated from the complex signal may be used in a feedback loop to perform automatic frequency control (AFC). Furthermore, in some embodiments automatic volume control (AVC) may be efficiently implemented on the demodulated signal to obtain an output that maintains a substantially steady volume, even in the presence of channel interference, fading or the like.

While the scope of the present invention is not limited in this regard, in some embodiments an AM receiver may be implemented using a substantial amount of digital circuitry, and an entire AM receiver may be implemented on a single integrated circuit (IC) having both analog front-end circuitry to receive and downconvert an incoming RF signal, as well as digital circuitry such as a digital signal processor (DSP) or other digital circuitry to process the baseband signal to obtain a demodulated output. Furthermore, in some implementations an AM receiver may be combined in a single IC (e.g., on the same monolithic die) with an FM receiver/transmitter (i.e., transceiver). In such embodiments, a substantial amount of circuitry for both AM and FM reception modes, as well as for FM transmission, may be reused. In some implementations, to effect such operations a single set of receiver circuitry may be provided, and a different firmware image may be selected for operation in an AM or FM mode. Owing to the relatively small size of such an IC, embodiments may be configured for use in portable devices, such as cellular telephones, personal media players such as MP3 players and personal digital assistants (PDAs), although the scope of the present invention is not limited in this regard.

Figure 1:
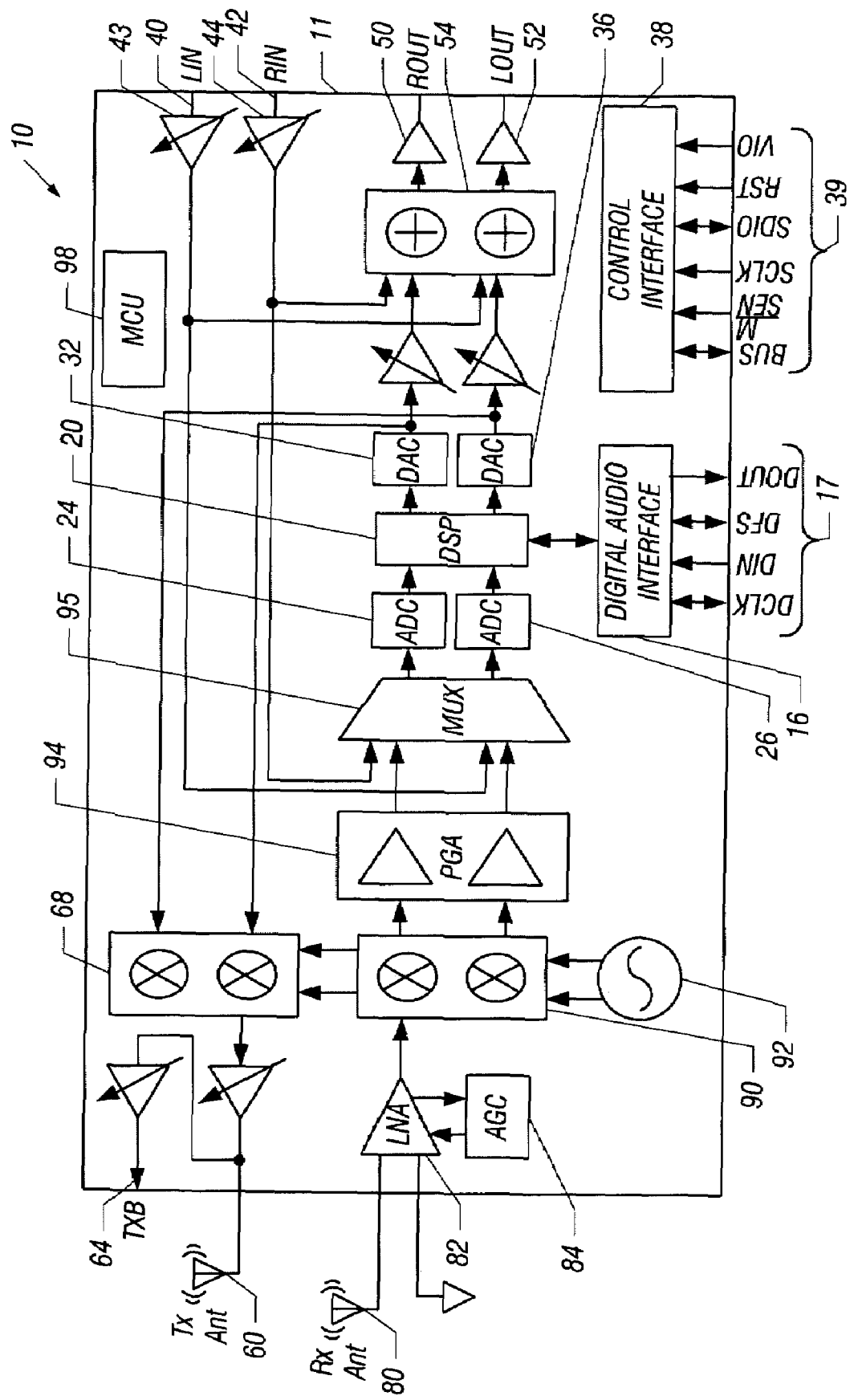
FIG. 1 is a block diagram of a multimode transceiver in accordance with one embodiment of the present invention.

Referring now to FIG. 1, in accordance with embodiments of the invention described herein, a multimode combined AM/frequency modulation (FM) transceiver 10, which may be fabricated on a monolithic semiconductor die 11, has several different signal processing modes of operations, in which the transceiver 10 may perform FM transmission, AM or FM reception, analog mixing, digital mixing and codec functions. More specifically, as described herein, the multimode FM transceiver 10 has an FM transmit mode in which the transceiver 10 functions as an FM transmitter; an AM or FM receive mode in which the transceiver 10 functions as a receiver; and an audio mode in which the transceiver 10 functions as a codec. In each of these modes of operation, the multimode transceiver 10 may perform various analog and/or digital mixing functions. Additionally, in accordance with some embodiments of the invention, the multimode transceiver 10 includes a digital audio interface 16, which allows the communication of digital audio signals between the transceiver 10 and circuitry ("off-chip" circuitry, for example) that is external to the transceiver 10.

In accordance with embodiments of the invention the FM transmit, AM and FM receive and audio modes are orthogonal in that the multimode transceiver 10 is in only one of the modes at a time. However, it is understood that in other embodiments of the invention, the multimode transceiver may operate in two or more of the modes concurrently. In general, the multimode transceiver 10 may receive one or more of the following input source signals in accordance with some embodiments of the invention: a digital audio (called "DIN"), which is received through the digital audio interface 16; an incoming RF signal that is received from an external receive antenna 80; a digital audio band signal that is received from the digital audio interface 16; and left channel (called "LIN") and right channel (called "RIN") analog stereo channel signals that are received at input terminals 40 and 42, respectively.

Depending on the particular configuration of the multimode transceiver 10, the transceiver 10 is capable of mixing two or more of its input source signals together to generate one or more of the following output signals: an outgoing FM transmission signal to drive an external transmit antenna 60; left channel (called "LOUT") and right channel (called "ROUT") analog stereo signals that appear at output terminals 52 and 50, respectively; and a digital output signal (called "DOUT") that is routed through the digital audio interface 16. In accordance with some embodiments of the invention, the multimode transceiver 10 may also provide a low impedance RF transmission output signal (called "TXB") at an output terminal 64 for purposes of driving a low impedance load.

As described herein, the multimode transceiver 10 may reuse some of its hardware components for purposes of reducing the complexity and size of the transceiver 10, as well as reducing the overall time that may be consumed designing the transceiver 10. For example, in accordance with some embodiments of the invention, a digital signal processor (DSP) 20 of the multimode transceiver 10 performs both digital FM modulation (for the FM transmit mode) and digital AM and FM demodulation (for the receive mode) for the transceiver 10. As another example of the hardware reuse, analog-to-digital converters (ADCs) 24 and 26 of the multimode transceiver 10 perform transformations between the analog and digital domains for both complex (when the transceiver 10 is in the FM receive mode) and real (when the transceiver 10 is in the transmit modes) signals. Additionally, the ADCs 24 and 26 may be used in the audio mode for purposes of digitizing the LIN and RIN stereo channel signals.

As another example of hardware reuse by the multimode transceiver 10, in accordance with some embodiments of the invention, digital-to-analog converters (DACs) 32 and 36 of the transceiver 10 convert digital audio band signals from the digital to the analog domain for both the receive and audio modes. The DACs 32 and 36 are also used during the FM transmit mode for purposes of converting intermediate frequency (IF) band signals from the digital to the analog domain.

Turning now to the overall topology of the multimode transceiver 10, the transceiver 10 includes a multiplexer 95 for purposes of routing the appropriate analog signals to the ADCs 24 and 26 for conversion. For example, the multiplexer 95 may select an incoming analog IF signal during the receive mode and select the LIN and RIN stereo channel signals during the FM transmit and audio modes. The digital signals that are provided by the ADCs 24 and 26 are routed to the DSP 20.

For the receive modes, the multimode transceiver 10 includes analog mixers 90 that are coupled to a tunable local oscillator 92, the frequency of which selects the desired radio channel to which the transceiver 10 is tuned. In response to the incoming RF signal, the mixers 90 produce corresponding analog IF, quadrature signals that pass through programmable gain amplifiers (PGAs) 94 before being routed to the ADCs 24 and 26. Thus, the ADCs 24 and 26 convert the analog IF quadrature signals from the PGAs 94 into digital signals, which are provided to the DSP 20. The DSP 20 demodulates the received complex signal to provide corresponding digital left and right channel stereo signals at its output terminals; and these digital stereo signals are converted into the analog counterparts by the DACs 32 and 36, respectively. As described further below, mixing may then be performed by mixers, or analog adders 54, which provide the ROUT and LOUT stereo signals at the output terminals 50 and 52, respectively. It is noted that the digital demodulated stereo signals may also be routed from the DSP 20 to the digital audio interface 16 to produce the DOUT digital signal.

In the FM transmit mode of the multimode transceiver 10, the content to be transmitted over the FM channel (selected by the frequency of the local oscillator 92, for example) may originate with the DIN digital data signal, the LIN and RIN stereo channel signals or a combination of these signals. Thus, depending on whether the analog signals communicate some or all of the transmitted content, the multimode transceiver 10 may use the ADCs 24 and 26. The DSP 20 performs FM modulation on the content to be transmitted over the FM channel to produce digital orthogonal FM signals, which are provided to the DACs 32 and 36 to produce corresponding analog orthogonal FM signals, which are in the IF range. Analog mixers 68 (which mix the analog orthogonal FM signals with a frequency that is selected by the local oscillator 92) of the multimode transceiver 10 frequency translate and combine the signals to produce an RF FM signal that is provided to the transmit antenna 60. In the audio mode of the multimode transceiver 10, the DSP 20 may be used to perform digital mixing. Analog mixing in the audio mode may be performed using the adder 54.

Among the other features of the multimode transceiver 10, in accordance with some embodiments of the invention, the transceiver 10 includes a control interface 38 for purposes of receiving various signals 39 that control the mode (FM transmit, AM or FM receive or audio) in which the transceiver 10 is operating, as well as the specific submode configuration for the mode, as further described below. For example, different firmware present in the DSP 20 may be executed based on the selected mode of operation. In accordance with some embodiments of the invention, the multimode FM transceiver 10 may also include a microcontroller unit (MCU) 98 that coordinates the general operations of the transceiver 10, such as configuring the ADCs 24 and 26 and DACs 32 and 36, configuring data flow through the multiplexer 95, or the like.

Using the transceiver 10 of FIG. 1 (for example), digital demodulation of incoming RF signals may be performed. In AM operation, a received AM signal, r(t), has the form:

$$r(t) = k(A+m(t))\cos(\omega_o t + \Theta) \quad [1]$$

In Equation 1, the message is m(t). In turn, $\omega_o$ is the carrier signal and $\Theta$ corresponds to a phase of the transmitter, which is unknown at a receiver, and k is a value associated with a communication channel. For AM, A is chosen so that A+m(t) is always greater than zero. Many transmitters are configured such that A is set to 1 to guarantee that A+m(t) is greater than zero. Note that m(t) can vary with the message, and k can vary with the environment in which the signal is transmitted.

For AM demodulation, the amplitude of the signal may be determined. Such a determination may be aided in a receiver that performs a complex first stage demodulation. In such a system, the incoming signal is first demodulated to an IF signal. Both in-phase (I) and quadrature (Q) components may be demodulated to an IF signal. Hence, there are two components to the AM signal:

$$r_I(t) = k(A+m(t))\cos(\omega_{IF} t + \Theta) \quad [2]$$

$$r_Q(t) = k(A+m(t))\sin(\omega_{IF} t + \Theta) \quad [3]$$

In Equations 2 and 3, $\omega_{IF}$ may correspond to the frequency of the carrier signal plus or minus the local oscillator frequency used to downconvert the RF signal to IF. To eliminate the carrier signal, the magnitude may be computed as follows:

$$R(t) = (r_I^2(t) + r_Q^2(t))^{1/2} = (k^2(A+m(t))^2[\cos^2(\omega_{IF}t+\Theta) + \sin^2(\omega_{IF}t+\Theta)])^{1/2} = k(A+m(t)) \quad [4]$$

In various embodiments, a coordinate rotation digital computer (CORDIC) function such as may be performed via a CORDIC coprocessor or by software executing on generic hardware can be used to obtain the magnitude information. Note that in these embodiments, the squaring, summing, and square root operations described above may be implemented as a single operation, since a CORDIC engine may convert rectangular coordinates (i.e., x, y) to polar coordinates (r, $\Theta$), and the relationship between x, y and r is:

$$r = (x^2 + y^2)^{1/2} \quad [5]$$

Figure 2:
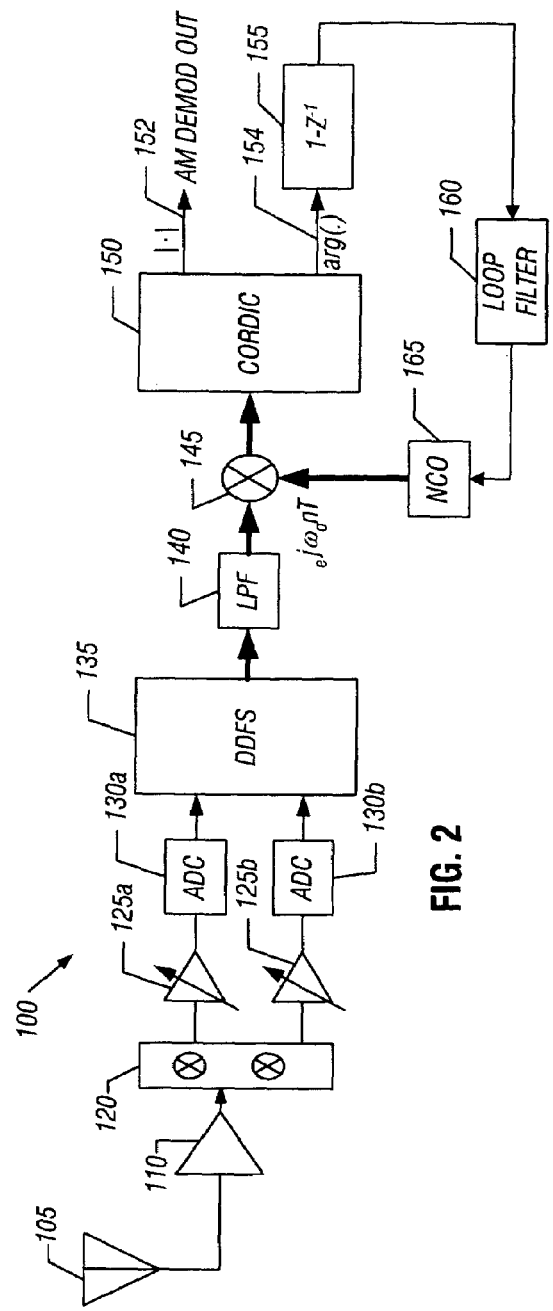
FIG. 2 is a block diagram of an AM receiver in accordance with an embodiment of the present invention.

Referring now to FIG. 2, shown is a block diagram of an AM receiver in accordance with an embodiment of the present invention. In some embodiments, receiver 100 of FIG. 2 may be implemented via the various components of transceiver 10 described above, although the scope of the present invention is not limited in this aspect. As shown in FIG. 2, receiver 100 is used to receive and process an incoming AM signal. Receiver 100 includes an antenna 105 to receive an RF signal and provide it to a low noise amplifier (LNA) 110. The output of LNA 110 is provided to a complex mixer 120 which generates I and Q signals therefrom. While not shown in the embodiment of FIG. 2, in various implementations mixer 120 may be controlled by an output of a voltage controlled oscillator (VCO) or a numerically controlled oscillator (NCO). The complex outputs of mixer 120 may be amplified in programmable gain amplifiers (PGAs) 125a and 125b. PGAs 125a and 125b may operate based on automatic gain control (AGC) to output a signal of substantially steady gain, in some embodiments. Complex mixer 125 may mix the incoming RF signals down to a low intermediate frequency (IF) value. In various instances, incoming signals may be provided with positive gain (i.e., amplification) or negative gain (i.e., attenuation) in PGAs 125, based on various circumstances. The output of PGAs 125a and 125b may be provided to corresponding analog-to-digital converters (ADCs) 130a and 130b. The outputs of ADCs 130a and 130b may be provided to a direct digital frequency synthesizer (DDFS) 135 that may generate a downmixed baseband complex signal, which may in turn be filtered via a low pass filter (LPF) 140. The filtered complex signal may then be multiplied by a complex exponential (described further below) in a combiner such as a multiplier 145. The output of multiplier 145 may be provided to a CORDIC engine 150 that performs CORDIC operations on the incoming value to obtain both magnitude and phase information, i.e., polar coordinate information.

In one embodiment, CORDIC engine 150 may be implemented using minimal amounts of hardware, e.g., adders, accumulators and comparators, which may be operated according to a state machine. Furthermore, a small lookup table that includes a minimal amount of values for different incoming information may also be present. The magnitude portion of the CORDIC function may correspond to a demodulated signal. Thus as shown in FIG. 2, output 152 of CORDIC engine 150 may correspond to the demodulated AM signal, which may be provided to one or more desired locations such as an output device, e.g., a speaker, a storage device and so forth.

Referring still to FIG. 2, note that the phase portion of the output of CORDIC engine 150, i.e., output 154, may be provided to a differentiator 155. The output of differentiator 155, which may be a varying voltage in response to a constant input, or a constant voltage in response to a varying input, may be provided to a loop filter 160 which may be an LPF that in turn is coupled to an NCO 165, which generates the complex exponential, which corresponds to a demodulating carrier signal. This feedback loop acts to drive a phase difference (i.e., frequency) between transmitter and receiver to zero. In this way, the output of NCO 165 may be used to remove the residual frequency offset from the incoming signal to multiplier 145.

Note that some embodiments, a substantial amount of the components shown in FIG. 2 may be implemented in software. For example, in one embodiment LPF 140, CORDIC engine 150 and the feedback loop may be performed in software running on a DSP. To that end, embodiments may include an article in the form of a computer-readable medium onto which instructions are written. These instructions may enable the DSP or other programmable processor to perform digital demodulation in accordance with an embodiment of the present invention.

Using an embodiment such as that of FIG. 2, the demodulator output may thus be independent of the instantaneous frequency of the incoming signal. In other implementations, a feedback loop of a receiver may be used to attempt to drive a phase value to zero. In other words, instead of driving a phase difference (i.e., frequency) to zero, a phase of the value (i.e., the demodulating carrier phase relative to the incoming AM signal) may be driven to zero. When this phase value is zero, the frequency (i.e., phase difference) may also be zero. Thus embodiments may perform automatic frequency control (AFC) via a feedback loop incorporating a CORDIC function. In this way, a need for a dedicated AM detector can be avoided.

Figure 3:
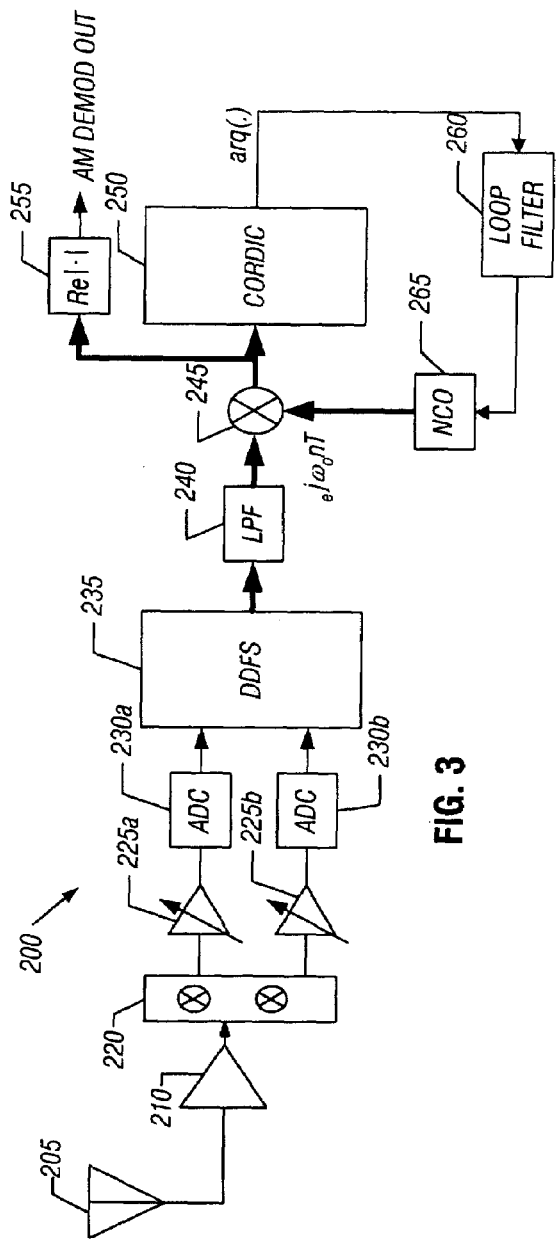
FIG. 3 is a block diagram of an AM receiver in accordance with another embodiment of the present invention.

Referring now to FIG. 3, shown is a block diagram of an AM receiver in accordance with another embodiment of the present invention. As shown in FIG. 3, AM receiver 200 may include a front end having the same basic structure described above with regard to FIG. 2. Specifically, as shown in FIG. 3, receiver 200 includes an antenna 205 to receive an RF signal and provide it to a low noise amplifier (LNA) 210. The output of LNA 110 is provided to a complex mixer 220 which generates I and Q signals therefrom. The complex outputs of mixer 220 may be amplified in PGAs 225a and 225b. The output of PGAs 225a and 225b may be provided to corresponding ADCs 230a and 230b. The outputs of ADCs 230a and 230b may be provided to a DDFS 235 that may generate a downmixed baseband complex signal, which may in turn be filtered via a LPF 240. The filtered complex signal may then be multiplied in a combiner such as a multiplier 245 by a complex exponential. The output of multiplier 245 may be provided to a CORDIC engine 250 to obtain both magnitude and phase information, i.e., polar coordinate information.

Note that the output of multiplier 245 is provided both to CORDIC engine 250 and a splitter 255, which acts to pull the real portion of the complex value from the output of multiplier 245. This real portion thus output by splitter 255 may be the demodulated signal.

In the embodiment of FIG. 3, the output of CORDIC engine 250 (i.e., the phase output) may be provided to loop filter 260, which may act as a low pass filter to filter the phase signal and provide it to NCO 265 that generates the complex exponential that may then be provided to multiplier 245 to remove the residual frequency offset to the input to multiplier 245. In the embodiment of FIG. 3, improved demodulation may occur under poor signal conditions. For example, in cases of low signal to noise ratio (SNR) due to various conditions, improved performance may result using the embodiment of FIG. 3 over the embodiment of FIG. 2.

Using the embodiment of FIG. 2, the output of CORDIC engine 150, i.e., the demodulated signal may still have an arbitrary phase. However, since only the magnitude output from CORDIC engine 150 is used for the demodulated signal, performance is not impacted. In the embodiment of FIG. 3, in contrast, the output of CORDIC engine 250 may be phase locked with regard to the input signal. Note that while shown with these implementations in the embodiments of FIGS. 2 and 3, the scope of the present invention is not limited in this way. Furthermore, understand that in many implementations, the CORDIC engine along with the feedback loop (and low pass filter at the front end of the CORDIC engine) may be implemented via hardware, firmware or software. Accordingly, in many implementations a DSP, general-purpose processor or other processing unit may perform the functions ascribed to these components via execution of software and/or firmware.

Note that because many of the components shown in both FIGS. 2 and 3 may be implemented in software executing on generic hardware, a single hardware implementation may include software that can execute in accordance with both of the embodiments of FIGS. 2 and 3. That is, software may be present for both embodiments, and a controller may select an appropriate demodulation technique. For example, based on given signal conditions, the embodiment of FIG. 2 may be favored over FIG. 3, or vice versa. Of course, in other implementations a single software routine may be present to perform demodulation in accordance with one of FIGS. 2 and 3. Still further, instead of software-based operation, actual hardware implementations in accordance with the embodiments of FIGS. 2 and 3 may be present instead.

In various embodiments, NCO 165 and 265 may be realized using the same CORDIC functionality used for CORDIC engines 150 and 250. That is, in some implementations polar coordinate information may be input into the CORDIC algorithm, essentially operating backwards to provide rectangular (i.e., sine and cosine) outputs.

Figure 4:
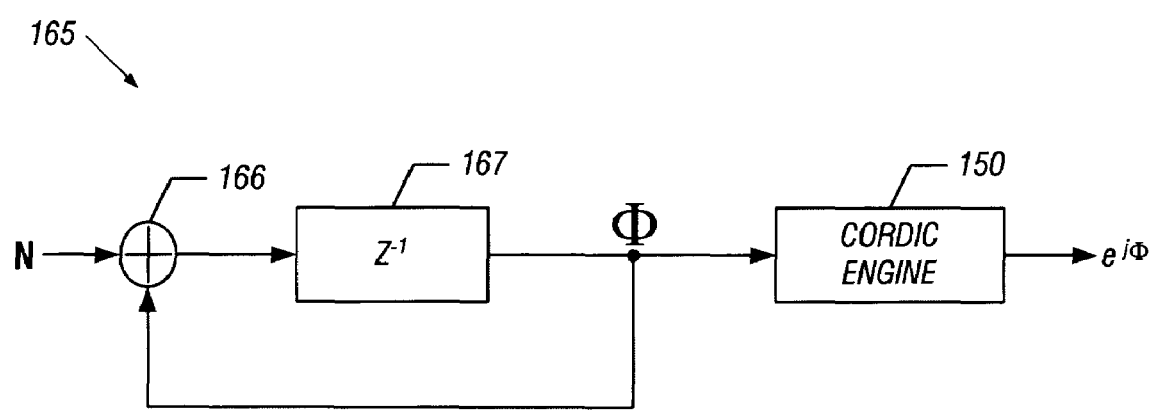
FIG. 4 is a block diagram of a controlled oscillator in accordance with one embodiment of the present invention.

As mentioned above, in some embodiments an NCO may be implemented using CORDIC functionality. Referring now to FIG. 4, shown is a block diagram of an NCO in accordance with an embodiment of the present invention. As shown in FIG. 4, NCO 165, which may correspond to NCO 165 of FIG. 2, for example, is coupled to receive an incoming signal, i.e., a voltage signal N (e.g., output from loop filter 160 in the embodiment of FIG. 2) at a summer 166. Summer 166 is further coupled to receive a feedback value from an output of a digital filter 167 that itself is coupled to an output of summer 166. Accordingly, the feedback loop may drive the output of summer 166 to generate a phase angle $\Phi$ out of filter 167. In other embodiments, an accumulator may take the place of filter 167. In turn, this phase value may be provided to a CORDIC engine 150, which may correspond to CORDIC engine 150 of FIG. 2. However, in the embodiment of FIG. 4, CORDIC engine 150 may operate in reverse, receiving a polar coordinate value, i.e., $\Phi$, and generating rectangular coordinates, namely sine and cosine values therefrom. Specifically, the output of CORDIC 150 may correspond to a complex exponential number, e.g., $e^{j\Phi}$. This value more specifically may be a negative exponential value which may be provided to a multiplier in order to remove frequency information from an incoming signal also provided to the multiplier (e.g., multiplier 145 of FIG. 2).

As shown in FIGS. 2 and 3, the demodulated output signal may be converted back to an analog signal by a converter (not shown in FIGS. 2 and 3) and provided directly out of a receiver and used as an audio signal, e.g., to a speaker output, headphone output, recording device and so forth. However, additional signal processing may be performed on the demodulated signal in some implementations. For example, particularly in cases where a receiver is mobile and moved during use, signal fading may occur. Thus, a given channel may suffer from interference by various sources. As a result, during operation the volume of a tuned channel may vary. While a user can increase or decrease the volume of a device including the receiver (if volume controls are currently accessible to the user), this may be undesirable as the volume changes may occur rapidly, or may occur for only short periods of time. Or the volume changes may occur in relatively small increments so that a user does not notice the volume change for some time. Accordingly, in some implementations automatic volume control (AVC) may be provided to further process a demodulated signal to generate an audio signal with a substantially constant volume. This process may be performed automatically, i.e., transparently to a user, so that the user remains unaware of channel conditions causing a change in signal intensity (i.e., volume).

As described above, a received signal may have a value k, associated with the communication channel, which can vary with the environment. In one embodiment, AVC may be implemented, in part by isolating k via tracking the kA term and adjusting it to keep it constant. Since AM transmissions typically do not vary A, this method can provide suitable performance. To obtain a statistic for kA, the other components of the transmitted signal may be eliminated.

In embodiments using a CORDIC engine, the magnitude information obtained by demodulation, i.e., k(A+m(t)), may also be used to perform automatic volume control. Specifically, having obtained k(A+m(t)) a restriction may be imposed such that Em(t)=0. That is, the average energy of the message information equals zero. Since m(t) is an audio waveform, it has little to no energy below 20 Hz. Thus a low pass filter with bandwidth of, e.g., 20 Hz or less may be used to recover kA and reject km(t). Changes in kA then may be tracked out to provide automatic volume control.

Figure 5:
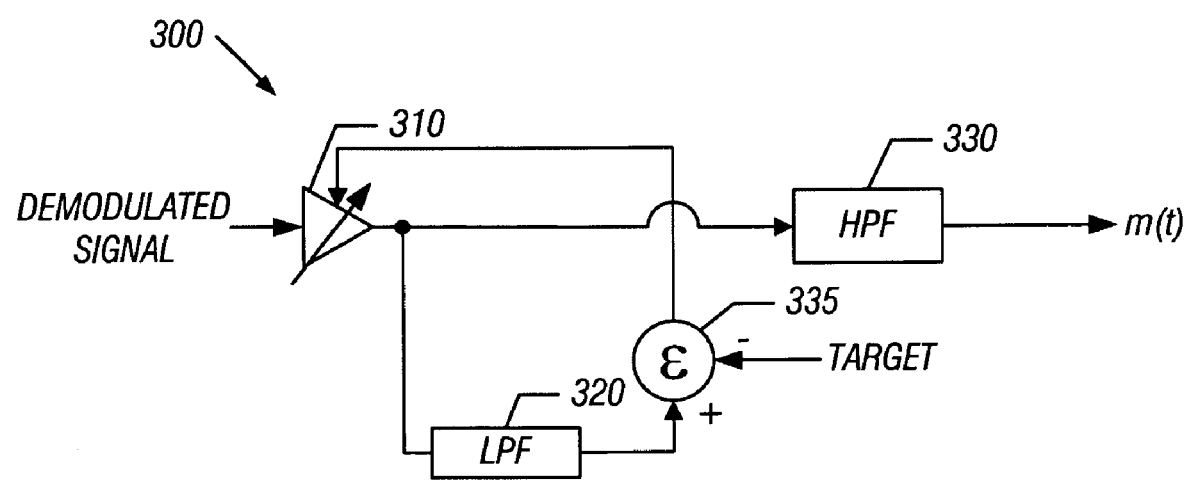
FIG. 5 is a block diagram of an automatic volume control circuit in accordance with one embodiment of the present invention.

Referring now to FIG. 5, shown is a block diagram of an AVC circuit in accordance with one embodiment of the present invention. As shown in FIG. 5, AVC circuit 300 may receive an incoming demodulated signal. As examples, the received demodulated signal may come from one of receivers 100 or 200, although the scope of the present invention is not limited in this regard. For example, in other implementations a conventional analog AM receiver including a rectifier and RC filter may provide the AM demodulated signal to AVC circuit 300.

The demodulated signal is provided to an amplifier 310, which may be a PGA. PGA 310 may be controlled based on information from a feedback loop. Specifically, as shown in FIG. 5, the output of amplifier 310 is provided to a low pass filter (LPF) 320. LPF 320 may be used to filter out the message information, i.e., m(t), from the demodulated signal. Accordingly, the output of LPF 320 may correspond to channel-specific information. In other words, the output of LPF 320 may correspond to kA. Based on the value of kA, amplifier 310 may be controlled accordingly.

Specifically, a summer or comparator 335 may be coupled to receive the output of LPF 320. In addition, summer 335 receives a threshold level, which may correspond to a target volume. In various embodiments, this target volume may be set at a fixed amount, or may be adjusted based on various conditions, either by the receiver itself or under user control. The output of summer 335 is provided to a control input of PGA 310 to thus control the gain of PGA 310. Accordingly, if the signal is fading, kA becomes smaller and the gain provided by amplifier 310 may be increased. In vice-versa operation, the gain of amplifier may be attenuated when signal strength is increasing in the channel.

The output of amplifier 310 is further coupled to a high pass filter (HPF) 330. HPF 330 may be used to remove the channel-specific information (i.e., kA) from the demodulated signal. Accordingly, the output of HPF 330 may correspond to the message information of the demodulated signal, i.e., m(t). Further, because of the automatic volume control provided by AVC 300, m(t) should remain at a steady level, regardless of input signal conditions, e.g., in cases of interference and so forth. Accordingly, using AVC circuit 300, embodiments may provide an output signal, e.g., to a speaker or other location, that remains at a steady volume level even in the presence of a channel that is impaired due to interference or another reason. While shown with this particular implementation in the embodiment of FIG. 5, the scope of the present invention is not limited in this regard. Furthermore, it is to be understood that AVC circuit 300 may be implemented in hardware, software, firmware or combinations thereof. For example, a DSP that performs the demodulation of received signals, such as may be used to implement the receivers of FIGS. 2 and 3, may further be programmed to perform AVC functionality. For example, PGA 310 (and the other components) may be implemented in software. Thus PGA 310 may be effected via code that receives an incoming demodulated signal and multiplies it by a coefficient (e.g., from a lookup table) selected by the feedback information (e.g., kA).

Figure 6:
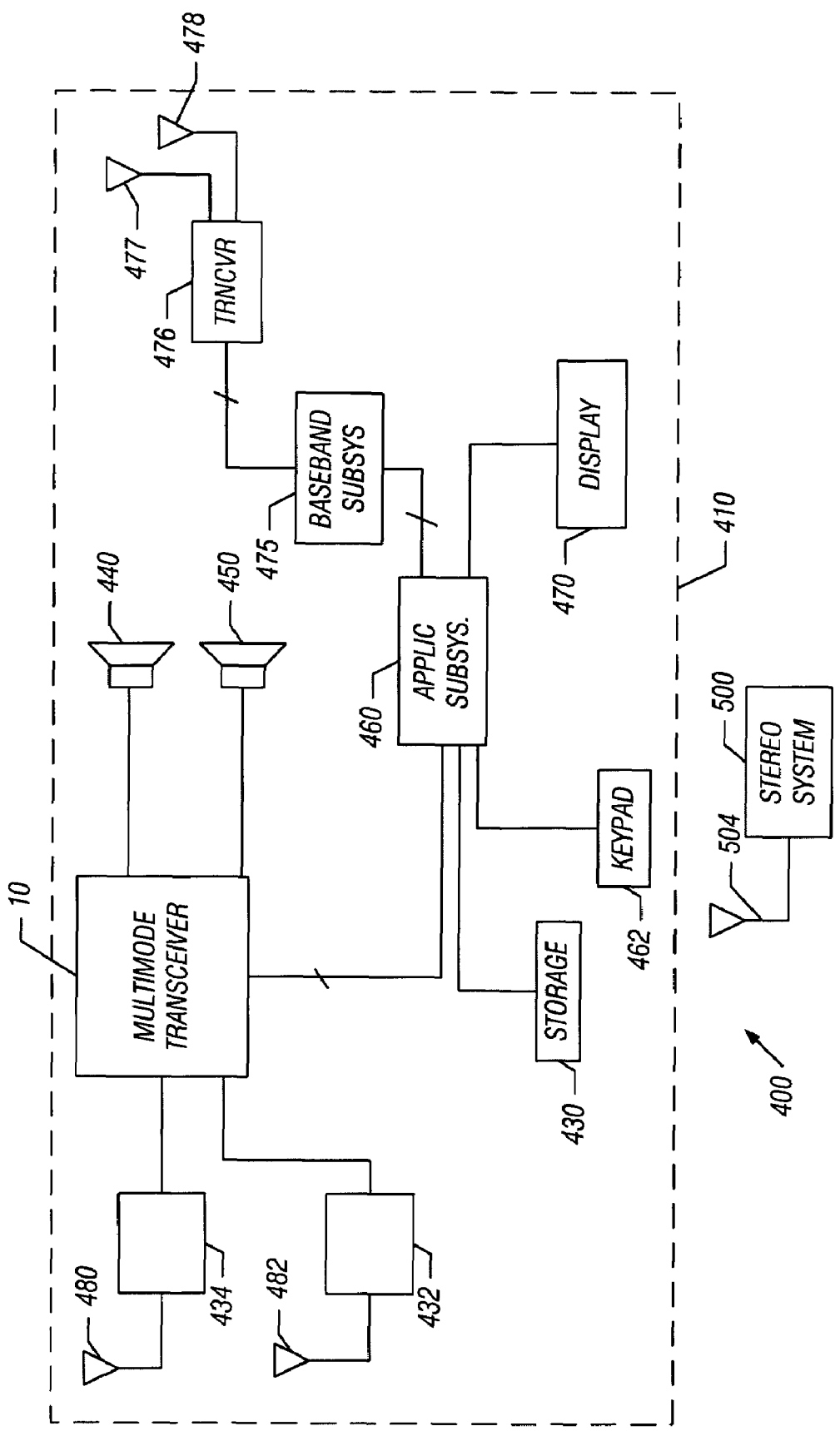
FIG. 6 is a block diagram of a system in accordance with one embodiment of the present invention.

Referring to FIG. 6, in accordance with some embodiments of the invention, the multimode transceiver 10 may be part of a multimedia portable wireless device 410, which, in turn, is part of a wireless system 400. As examples, the wireless device 410 may be a dedicated MP3 player, a cellular telephone or PDA with the capability of playing music downloads, part of a wireless link between a satellite antenna and an FM receiver, etc.

Among its other various functions, the wireless device 410 may store digital content on a storage 430, which may be a flash memory or hard disk drive, as a few examples. The wireless device 410 generally includes an application subsystem 460 that may, for example, receive input from a keypad 462 of the wireless device 410 and display information on a display 470. Furthermore, the application subsystem 460 may generally control the retrieval and storage of content from the storage 430 and the communication of, e.g., audio with the multimode transceiver 10. As shown, the multimode FM transceiver 10 may be directly connected to speakers 440 and 450 for output of audio data. As depicted in FIG. 6, the multimode FM transceiver 10 may be coupled by a matching network 434 to a receiver antenna 480 and may be coupled by a matching network 432 to the transmit antenna 482.

Although the wireless device 410 may include the speakers 440 and 450, it may be desirable to play sounds that are generated by the wireless device 410 over a more sophisticated speaker system. Therefore, in accordance with some embodiments of the invention, the wireless device 410, via the multimode FM transceiver 10, may broadcast content to be played over an FM channel to the receiver of an adjacent stereo system 500 (as an example). As shown, the stereo system 500 includes an RF antenna 504 for purposes of receiving the transmitted content from the wireless device 410.

In accordance with some embodiments of the invention, the wireless device 410 may have the ability to communicate over a communications network, such as a cellular network. For these embodiments, the wireless device 410 may include a baseband subsystem 475 that is coupled to the application subsystem 460 for purposes of encoding and decoding baseband signals for this wireless network. Baseband subsystem 470 may be coupled to a transceiver 476 that is connected to corresponding transmit and receive antennas 477 and 478.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving an amplitude modulation (AM) signal in a receiver;
   performing a coordinate rotation digital computer (CORDIC) operation in obtaining a demodulated AM signal; and
   providing a phase output of the CORDIC operation to a feedback loop to drive a phase difference between the AM signal and a demodulating carrier signal of the feedback loop to zero.

2. The method of claim 1, further comprising providing a magnitude output of the CORDIC operation as the demodulated AM signal.

3. The method of claim 1, further comprising providing the phase output to the feedback loop to drive a phase of the demodulating carrier signal relative to the AM signal to zero.

4. The method of claim 1, further comprising converting the received AM signal to a complex baseband signal and multiplying the complex baseband signal by the demodulating carrier signal of the feedback loop.

5. The method of claim 4, further comprising providing a magnitude output of the multiplying as the demodulated AM signal.

6. The method of claim 1, further comprising summing the phase output with a feedback signal to obtain a summed phase value, filtering the summed phase value and performing a second CORDIC operation on the filtered summed phase value to generate the demodulating carrier signal of the feedback loop, the demodulating carrier signal corresponding to a complex exponential signal.

7. An apparatus comprising:
   a receiver to receive an amplitude modulation (AM) signal and generate a complex baseband signal therefrom;
   a combiner to receive the complex baseband signal and a demodulating carrier signal of a feedback loop and to generate a complex output therefrom; and
   a coordinate rotation digital computer (CORDIC) engine to perform a CORDIC function on the complex output to obtain a polar result.

8. The apparatus of claim 7, wherein a magnitude of the polar result comprises a demodulated signal.

9. The apparatus of claim 7, further comprising a controller to select an output of the combiner or an output of the CORDIC engine to provide a demodulated signal.

10. The apparatus of claim 7, wherein the CORDIC engine comprises a software routine performed by a processor.

11. The apparatus of claim 7, wherein the feedback loop is coupled to an output of the CORDIC engine to generate the demodulating carrier signal comprising a complex exponential signal based on a phase of the polar result.

12. The apparatus of claim 11, wherein the feedback loop comprises:
   a loop filter coupled to an output of the CORDIC engine; and
   a controlled oscillator coupled to an output of the loop filter, wherein the controlled oscillator is to generate the complex exponential signal, wherein the complex exponential signal is to be coupled to an input of the combiner.

13. The apparatus of claim 12, wherein the feedback loop further comprises a differentiator coupled between the CORDIC engine and the loop filter.

14. The apparatus of claim 12, wherein the controlled oscillator comprises a numerically controlled oscillator including:
   a summer to receive and sum the output of the loop filter and a feedback signal;
   a filter to receive and filter the summed output to generate a filtered output, wherein the feedback signal corresponds to the filtered output; and
   the CORDIC engine to receive the filtered output and generate a rectangular result.

15. The apparatus of claim 12, wherein the feedback loop is to enable automatic frequency control of the AM signal without a dedicated detector.

16. The apparatus of claim 7, wherein the apparatus comprises a multimode receiver including an analog front end to receive and downconvert the AM signal to an intermediate frequency (IF) digitized signal and a processor to downconvert the IF digitized signal to baseband and to implement the CORDIC engine.

17. The apparatus of claim 16, wherein the multimode receiver is operable in an AM mode or a frequency modulation (FM) mode, based on user control.

18. A system comprising:
   a digital demodulator to perform digital demodulation on an amplitude modulation (AM) signal, the digital demodulator to receive a complex baseband signal generated from the AM signal and perform a coordinate rotation digital computer (CORDIC) operation on the complex baseband signal to generate polar information;
   a feedback loop coupled to receive a phase portion of the polar information and generate a complex exponential signal for input into the digital demodulator; and
   an output device to output an audio signal generated from the digital demodulation.

19. The system of claim 18, further comprising a converter to convert a magnitude portion of the polar information to obtain the audio signal, wherein the magnitude portion comprises a demodulated signal.

20. The system of claim 18, wherein the digital demodulator comprises:
   a combiner to combine the complex baseband signal and the complex exponential signal; and
   a CORDIC processor coupled to an output of the combiner to perform the CORDIC operation.

21. The system of claim 20, wherein the feedback loop comprises:
   a loop filter coupled to an output of the CORDIC processor; and
   a controlled oscillator coupled to an output of the loop filter, wherein the controlled oscillator is to generate the complex exponential signal.

22. The system of claim 21, wherein the controlled oscillator comprises a numerically controlled oscillator including:
   a summer to receive and sum the output of the loop filter and a feedback signal;
   a filter to receive and filter the summed output to generate a filtered output, wherein the feedback signal corresponds to the filtered output; and
   the CORDIC processor to receive the filtered output and generate a rectangular result.

23. The system of claim 20, wherein the feedback loop is to enable automatic frequency control of the AM signal without a dedicated detector.

* * * * *